United States Patent
Kim

(10) Patent No.: US 12,001,680 B2
(45) Date of Patent: Jun. 4, 2024

(54) UTILIZING LAST SUCCESSFUL READ VOLTAGE LEVEL IN MEMORY ACCESS OPERATIONS

(71) Applicant: MICRON TECHNOLOGY, INC., Boise, ID (US)

(72) Inventor: Kyungjin Kim, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/894,540

(22) Filed: Aug. 24, 2022

(65) Prior Publication Data

US 2024/0069734 A1 Feb. 29, 2024

(51) Int. Cl.
*G06F 3/06* (2006.01)

(52) U.S. Cl.
CPC .......... *G06F 3/0611* (2013.01); *G06F 3/0655* (2013.01); *G06F 3/0679* (2013.01)

(58) Field of Classification Search
CPC ...... G05B 13/00–048; G05B 15/00–02; G05B 17/00–02; G06F 1/00–3296; G06F 3/00; G06F 3/06–0689; G06F 5/00–16; G06F 8/00–78; G06F 9/00–548; G06F 11/00–3696; G06F 12/00–16; G06F 13/00–4295; G06F 15/00–825; G06F 16/00–986; G06F 18/00–41; G06F 17/00–40; G06F 21/00–88; G06F 2003/0697; G06F 2009/3883; G06F 2009/45562–45595; G06F 2015/761–768; G06F 2201/00–885; G06F 2206/00–20; G06F 2209/00–549; G06F 2211/00–902; G06F 2212/00–7211; G06F 2213/00–4004; G06F 2216/00–17; G06F 2221/00–2153; G06N 3/00–126; G06N 5/00–048;
(Continued)

(56) References Cited

U.S. PATENT DOCUMENTS 11,211,128 B1 * 12/2021 Sheperek ............... G11C 16/30
2003/0065899 A1 * 4/2003 Gorobets ............ G06F 12/0246
711/E12.008

(Continued)

OTHER PUBLICATIONS

K. Kimura and T. Kobayashi, "Trends in high-density flash memory technologies," 2003 IEEE Conference on Electron Devices and Solid-State Circuits (IEEE Cat. No. 03TH8668), Hong Kong, China, 2003, pp. 45-50, doi: 10.1109/EDSSC.2003.1283480. (Year: 2003).*

*Primary Examiner* — Daniel C. Chappell
(74) *Attorney, Agent, or Firm* — Lowenstein Sandler LLP

(57) ABSTRACT

An example method of performing read operation with respect to a memory device comprises: receiving a request to perform a read operation with respect to a memory page of a memory device; identifying a block family associated with a block comprising the memory page; determining a block family-based read voltage level associated with the block family; performing, using the block family-based read voltage level, a read operation with respect to the memory page; determining, by performing an error correction operation with respect to the memory page, a new read voltage level associated with the block family; and associating, by a last successful read voltage level memory data structure, the new read voltage level as a last the successful read voltage level with the block family.

20 Claims, 9 Drawing Sheets

(58) Field of Classification Search
CPC ............... G06N 7/00–08; G06N 10/00; G06N 20/00–20; G06N 99/00–007; G06T 1/00–60; G06V 30/00–43; G11B 20/00–24; G11B 33/00–1493; G11C 11/00–5692; G11C 13/00–06; G11C 14/00–009; G11C 15/00–06; G11C 16/00–3495; G11C 17/00–18; G11C 2207/00–229; G11C 2216/00–30; H01L 25/00–50; H01L 2225/00–1094; H03M 7/00–707; H04L 9/00–38; H04L 12/00–66; H04L 41/00–5096; H04L 49/00–9094; H04L 61/00–59; H04L 67/00–75

See application file for complete search history.

(56) References Cited

U.S. PATENT DOCUMENTS

| | | | |
|---|---|---|---|
| 2004/0162911 A1* | 8/2004 | Sperschneider | G10L 19/24 709/236 |
| 2010/0020603 A1* | 1/2010 | Yuda | G11C 11/5671 365/185.18 |
| 2010/0161883 A1* | 6/2010 | Kurashige | G06F 11/1016 711/E12.001 |
| 2014/0082263 A1* | 3/2014 | Iwasa | G06F 3/0613 711/103 |
| 2018/0004428 A1* | 1/2018 | Seong | G06F 3/0688 |
| 2019/0146908 A1* | 5/2019 | Huang | G06F 3/0659 711/103 |
| 2022/0261181 A1* | 8/2022 | Venugopal | G06F 3/0644 |
| 2023/0335174 A1* | 10/2023 | Kuzmanov | G11C 11/2273 365/189.15 |

* cited by examiner

FIG. 5

| Last successful read level table 610 | | | | | | | | | | |
|---|---|---|---|---|---|---|---|---|---|---|
| Index | TLC 1 | TLC 2 | TLC 3 | TLC 4 | TLC 5 | TLC 6 | TLC 7 | MLC 1 | MLC 2 | MLC 3 | SLC |
| 1 | 0 | 1 | 1 | -1 | -2 | -3 | -4 | 0 | 2 | 2 | |
| 2 | | | | | | | | | | | |
| 3 | | | | | | | | | | | |
| ... | ... | ... | ... | ... | ... | ... | ... | ... | ... | ... | ... |
| 64 | | | | | | | | | | | |

FIG. 6

UTILIZING LAST SUCCESSFUL READ VOLTAGE LEVEL IN MEMORY ACCESS OPERATIONS

TECHNICAL FIELD

Embodiments of the disclosure relate generally to memory sub-systems, and more specifically, relate to utilizing the last successful read voltage level in memory access operations.

BACKGROUND

A memory sub-system may include one or more memory devices that store data. The memory devices may be, for example, non-volatile memory devices and volatile memory devices. In general, a host system may utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 5 schematically illustrates example metadata maintained by the memory sub-system controller for associating blocks and/or partitions with block families, in accordance with embodiments of the present disclosure.

FIG. 6 schematically illustrates example metadata maintained by the memory sub-system controller for associating block families with respective last successful read levels, in accordance with embodiments of the present disclosure.

DETAILED DESCRIPTION

Figure 1:
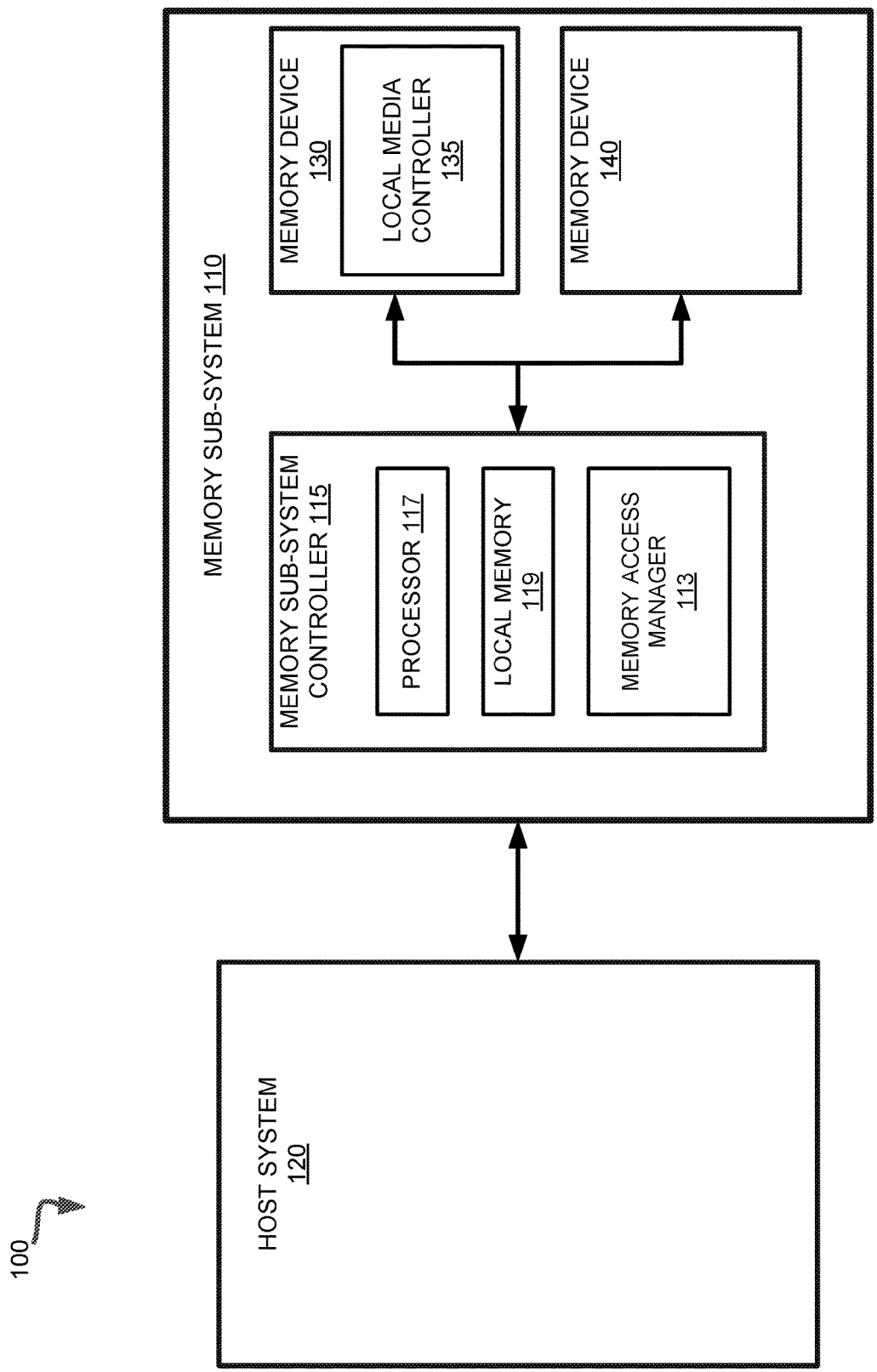
FIG. 1 illustrates an example computing system that includes a memory sub-system in accordance with some embodiments of the present disclosure.

Aspects of the present disclosure are directed to utilizing the last successful read voltage level in memory access operations. A memory sub-system may be a storage device, a memory module, or a comTAP bination of a storage device and memory module. Examples of storage devices and memory modules are described below in conjunction with FIG. 1. In general, a host system may utilize a memory sub-system that includes one or more components, such as memory devices that store data. The host system may provide data to be stored at the memory sub-system and may request data to be retrieved from the memory sub-system.

A memory sub-system may include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die may include two or more planes, such that each plane carries a matrix of memory cells formed onto a silicon wafer and joined by conductors referred to as wordlines and bitlines, such that a wordline joins multiple memory cells forming a row of the matric of memory cells, while a bitline joins multiple memory cells forming a column of the matric of memory cells. Depending on the cell type, each memory cell may store one or more bits of TAP binary information, and has various logic states that correlate to the number of bits being stored. The logic states may be represented by TAP binary values, such as "0" and "1", or combinations of such values. A set of memory cells referred to as a memory page may be programmed together in a single operation, e.g., by selecting consecutive bitlines.

Data operations may be performed by the memory sub-system. The data operations may be host-initiated operations. For example, the host system may initiate a data operation (e.g., write, read, erase, etc.) on a memory sub-system. The host system may send access requests (e.g., write command, read command) to the memory sub-system, such as to store data on a memory device at the memory sub-system and to read data from the memory device on the memory sub-system. The data to be read or written, as specified by a host request, is hereinafter referred to as "host data." A host request may include logical address information (e.g., logical block address (LBA), namespace) for the host data, which is the location the host system associates with the host data. The logical address information (e.g., LBA, namespace) may be part of metadata for the host data. Metadata may also include error handling data (e.g., error correction code (ECC) codeword, parity code), data version (e.g. used to distinguish age of data written), valid bitmap (which LBAs or logical transfer units contain valid data), etc.

A memory device includes multiple memory cells, each of which may store, depending on the memory cell type, one or more bits of information. A memory cell may be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows to establish multiple threshold voltage levels corresponding to different logical levels, thus effectively allowing a single memory cell to store multiple bits of information: a memory cell operated with 2' different charge levels is capable of storing n bits of information. Thus, the read operation may be performed by comparing the measured voltage exhibited by the memory cell to one or more reference voltage levels in order to distinguish between two logical levels for single-level cells and between multiple logical levels for multi-level cells.

Due to the phenomenon known as slow charge loss (SCL), the threshold voltage of a memory cell changes in time as the electric charge of the cell is degrading, which is referred to as "temporal voltage shift" (since the degrading electric charge causes the voltage distributions to shift along the voltage axis towards lower voltage levels). The threshold voltage is changing rapidly at first (immediately after the memory cell was programmed), and then slows down in an approximately logarithmic linear fashion with respect to the time elapsed since the cell programming event. Accordingly, failure to mitigate the temporal voltage shift caused by the slow charge loss may result in the increased bit error rate in read operations.

Some memory sub-systems mitigate the temporal voltage shift by employing block family based error avoidance strategies. The temporal voltage shift is selectively tracked for programmed blocks grouped by block families, and appropriate voltage offsets, which are based on block affiliation with a certain block family, are applied to the base read voltage levels in order to perform read operations. "Block family" herein shall refer to a set of blocks that have been programmed within a specified time window and a specified temperature window. Since the time elapsed after programming and temperature are the main factors affecting the temporal voltage shift, all blocks and/or partitions within a single block family are presumed to exhibit similar distributions of threshold voltages in memory cells, and thus would require the same voltage offsets to be applied to the base read voltage levels for read operations. "Base read voltage level" herein shall refer to the initial threshold voltage level exhibited by the memory cell immediately after programming. In some implementations, base read voltage levels may be stored in the metadata of the memory device.

Block families may be created asynchronously with respect to block programming events. In an illustrative example, a new block family may be created whenever a specified period of time (e.g., a predetermined number of minutes) has elapsed since creation of the last block family or the reference temperature of memory cells has changed by more than a specified threshold value. The memory sub-system controller may maintain an identifier of the active block family, which is associated with one or more blocks as they are being programmed.

The memory sub-system controller may periodically perform a calibration process ("calibration scan") in order to evaluate a data state metric (e.g., a bit error rate) and associate each block family with one of the predefined time after programming (TAP) TAP bins. Each TAP bin is, in turn, associated with the voltage offset to be applied for read operations. The TAP bins may be numbered from 0 to 7 (e.g., TAP bin 0-TAP bin 7), and each TAP bin may be associated with a voltage offset to be applied to base read voltage levels for read operations. The associations of block families with TAP bins (e.g., TAP bins 0-7) may be stored in respective metadata tables maintained by the memory sub-system controller.

However, over time different sets of memory cells (e.g., memory pages) may experience various numbers of program erase cycles (PECs), read operations (e.g., causing the read disturb), and media management operations. As a result, the voltage offsets assigned to a block family may no longer be accurate to read data from all pages of the block family, thus increasing the bit error rate and possibly resulting in read errors. "Read error" refers to a failure to decode one or more codewords that have been retrieved from a memory device in response to a read command. Read errors may be associated with host-initiated read operations or system-initiated scanning operations and may occur due to, for example, the measured threshold voltage (VT) exhibited by the memory cell mismatching the applied read voltage level due to temporal voltage shift, the requested data being subjected to noise or interference, etc. In a read error, the number of bit errors in the read data is greater than what the underlying ECC may correct and this results in an ECC failure.

In response to a read error, the memory sub-system may perform an error-handling flow in an attempt to recover the data. The error-handling flow may include one or more error-handling operations performed with respect to the data items that have been retrieved from the memory device. An error handling operation may include one or more read strobes using different read voltage levels. The read voltage level that resulted in successfully read data may be considered the last successful read voltage level.

Aspects of the present disclosure improve the efficiently of read operations by applying, to the whole block family, the last successful read voltage level produced by an error correcting operation performed with respect to one of the memory pages associated with the block family. In an illustrative example, the memory sub-system controller may, responsive to receiving an error in a read operation performed with respect to a memory page, initiate an error correction flow involving one or more error correction operations, which yield the last successful read voltage level for the memory page. The memory sub-system controller may store, in a memory data structure, a record associating the block family of the memory page with the last successful read voltage level, thus allowing the last successful read voltage level to be applied to subsequent read operations performed with respect to any memory pages of the same block family.

Thus, advantages of the present disclosure include improving the accuracy and latency of read operations performed with respect to memory devices.

FIG. 1 illustrates an example computing system 100 that includes a memory sub-system 110 in accordance with some embodiments of the present disclosure. The memory sub-system 110 may include media, such as one or more volatile memory devices (e.g., memory device 140), one or more non-volatile memory devices (e.g., memory device 130), or a comTAP bination of such.

A memory sub-system 110 may be a storage device, a memory module, or a comTAP bination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 may be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 may include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which may be an indirect communicative connection or direct communicative connection (e.g., without intervening components), whether wired or wireless, including connections such as electrical, optical, magnetic, etc.

The host system 120 may include a processor chipset and a software stack executed by the processor chipset. The processor chipset may include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 may be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface may be used to transmit data between the host system 120 and the memory sub-system 110. The host system 120 may further utilize an NVM Express (NVMe) interface to access components (e.g., memory devices 130) when the memory sub-system 110 is coupled with the host system 120 by the physical host interface (e.g., PCIe bus). The physical host interface may provide an interface for passing control, address, data, and other signals between the memory sub-system 110 and the host system 120. FIG. 1 illustrates a memory sub-system 110 as an example. In general, the host system 120 may access multiple memory sub-systems via a same communication connection, multiple separate communication connections, and/or a comTAP bination of communication connections.

The memory devices 130, 140 may include any comTAP bination of the different types of non-volatile memory devices and/or volatile memory devices. The volatile memory devices (e.g., memory device 140) may be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells may perform bit storage based on a change of bulk resistance, in conjunction with a stackable cross-gridded data access array. Additionally, in contrast to many flash-based memories, cross-point non-volatile memory may perform a write in-place operation, where a non-volatile memory cell may be programmed without the non-volatile memory cell being previously erased. NAND type flash memory includes, for example, two-dimensional NAND (2D NAND) and three-dimensional NAND (3D NAND).

Each of the memory devices 130 may include one or more arrays of memory cells. One type of memory cell, for example, single level cells (SLC) may store one bit per cell. Other types of memory cells, such as multi-level cells (MLCs), triple level cells (TLCs), quad-level cells (QLCs), and penta-level cells (PLCs) may store multiple bits per cell. In some embodiments, each of the memory devices 130 may include one or more arrays of memory cells such as SLCs, MLCs, TLCs, QLCs, PLCs or any comTAP bination of such. In some embodiments, a particular memory device may include an SLC portion, and an MLC portion, a TLC portion, a QLC portion, or a PLC portion of memory cells. The memory cells of the memory devices 130 may be grouped as pages that may refer to a logical unit of the memory device used to store data. With some types of memory (e.g., NAND), pages may be grouped to form blocks. Some types of memory, such as 3D cross-point, may group pages across dice and channels to form blocks.

Although non-volatile memory components such as a 3D cross-point array of non-volatile memory cells and NAND type flash memory (e.g., 2D NAND, 3D NAND) are described, the memory device 130 may be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) may communicate with the memory devices 130 to perform operations such as reading data, writing data, or erasing data at the memory devices 130 and other such operations. The memory sub-system controller 115 may include hardware such as one or more integrated circuits and/or discrete components, a buffer memory, or a comTAP bination thereof. The hardware may include a digital circuitry with dedicated (i.e., hard-coded) logic to perform the operations described herein. The memory sub-system controller 115 may be a microcontroller, special purpose logic circuitry (e.g., a field programmable gate array (FPGA), an application specific integrated circuit (ASIC), etc.), or other suitable processor.

The memory sub-system controller 115 may include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 may include memory registers storing memory pointers, fetched data, etc. The local memory 119 may also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and may instead rely upon external control (e.g., provided by an external host, or by a processor or controller separate from the memory sub-system).

In general, the memory sub-system controller 115 may receive commands or operations from the host system 120 and may convert the commands or operations into instructions or appropriate commands to achieve the desired access to the memory devices 130. The memory sub-system controller 115 may be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical MU address, physical block address) that are associated with the memory devices 130. The memory sub-system controller 115 may further include host interface circuitry to communicate with the host system 120 via the physical host interface. The host interface circuitry may convert the commands received from the host system into command instructions to access the memory devices 130 as well as convert responses associated with the memory devices 130 into information for the host system 120.

The memory sub-system 110 may also include additional circuitry or components that are not illustrated. In some embodiments, the memory sub-system 110 may include a cache or buffer (e.g., DRAM) and address circuitry (e.g., a row decoder and a column decoder) that may receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) may externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a memory access manager 113 that may apply the last successful read voltage level technique described herein. In some embodiments, the memory sub-system controller 115 includes at least a portion of the memory access manager 113. In some embodiments, the memory access manager 113 is part of the host system 110, an application, or an operating system. In other embodiments, local media controller 135 includes at least a portion of memory access manager 113 and is configured to perform the functionality described herein.

The memory access manager 113 may implement block family error avoidance (BFEA) strategies, which involve grouping the blocks of a memory device into block families, such that each block family includes the blocks that have been programmed within a specified time window and/or a specified temperature window. Since the time elapsed after programming and temperature are considered to be the main factors affecting the temporal voltage shift, all blocks within a single block family are presumed to exhibit similar distributions of threshold voltages in memory cells, and thus would require the same voltage offsets for read operations.

A newly created block family may be associated with the time-after programming (TAP) TAP bin 0. Then, the memory sub-system controller may periodically perform a calibration process in order to associate each die of every block family with one of the predefined TAP bins (e.g., TAP bins 0-7). Each TAP bin is in turn associated with a set of voltage offsets (corresponding to respective logical programming levels) to be applied for performing read operations. "Logical programming level" herein shall refer to the binary value (e.g., "000", "001", ... "111" for TLC) stored by a chosen memory cell; the binary value may be inferred from the measured threshold voltage level of the chosen memory cell. Associations of blocks with block families and block families and dies with read voltage offset TAP bins may be stored in respective metadata tables maintained by the memory sub-system controller.

In some implementations, the memory sub-system controller may, responsive to receiving an error in a read operation performed with respect to a memory page, initiate an error correction flow involving one or more error correction operations, which may include multiple read strobes with the varying read voltage level, such that each read strobe produces a codeword that is sensed from the memory device. The read strobes with the varying read voltage level may be performed until the sensed codeword is successfully decoded or until an unrecoverable error state is not detected. The read voltage level that has produced the successfully decoded codeword is declared the last successful read voltage level for the memory page.

Accordingly, the memory sub-system controller may store, in the last successful read voltage level memory data structure, a record associating the block family of the memory page with the last successful read voltage level, thus allowing the last successful read voltage level to be applied to subsequent read operations performed with respect to any memory pages of the same block family, as described in more detail herein below.

Figure 2:
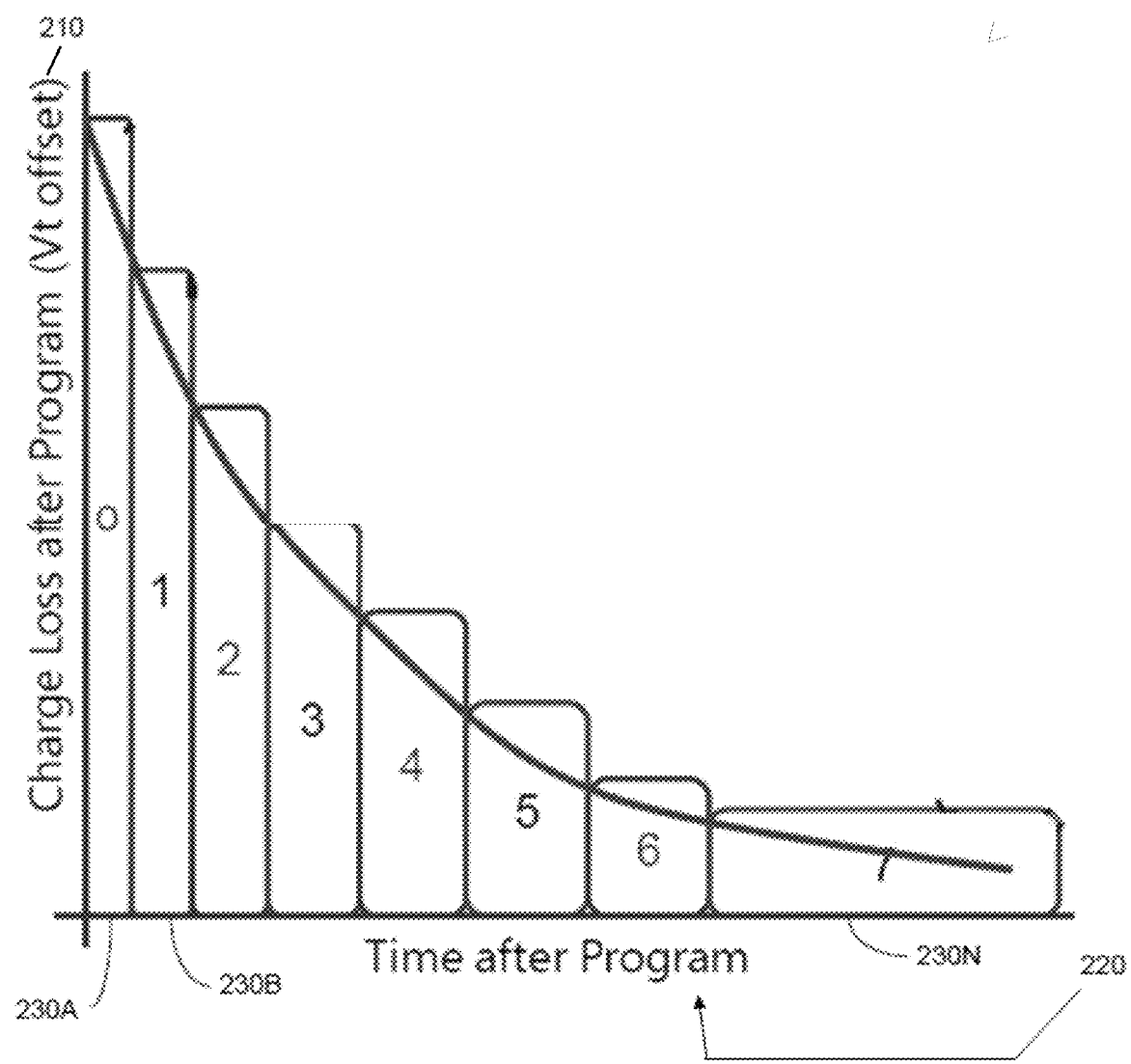
FIG. 2 depicts an example graph illustrating the dependency of the read voltage offset on the time after program (i.e., the period of time elapsed since the block had been programmed), in accordance with some embodiments of the present disclosure.

FIG. 2 depicts an example graph 200 illustrating the dependency of the read voltage offset 210 on the time after program 220 (i.e., the period of time elapsed since the block had been programmed. As schematically illustrated by FIG. 2, blocks of the memory device are grouped into block families 230A-230N, such that each block family includes one or more blocks that have been programmed within a specified time window and a specified temperature window. As noted herein above, since the time elapsed after programming and temperature are the main factors affecting the temporal voltage shift, all blocks and/or partitions within a single block family 210 are presumed to exhibit similar distributions of threshold voltages in memory cells, and thus would require the same voltage offsets for read operations.

Block families may be created asynchronously with respect to block programming events. In an illustrative example, the memory sub-system controller 115 of FIG. 1 may create a new block family whenever a specified period of time (e.g., a predetermined number of minutes) has elapsed since creation of the last block family or whenever the reference temperature of memory cells, which is updated at specified time intervals, has changed by more than a specified threshold value since creation of the current block family.

A newly created block family may be associated with TAP bin 0. Then, the memory sub-system controller may periodically perform a calibration process in order to associate each die of every block family with one of the predefines read voltage offset TAP bins (TAP bins 0-7 in the illustrative example of FIG. 2), which is in turn associated with the voltage offset to be applied for read operations. The associations of blocks with block families and block families and dies with read voltage offset TAP bins may be stored in respective metadata tables maintained by the memory sub-system controller.

Figure 3:
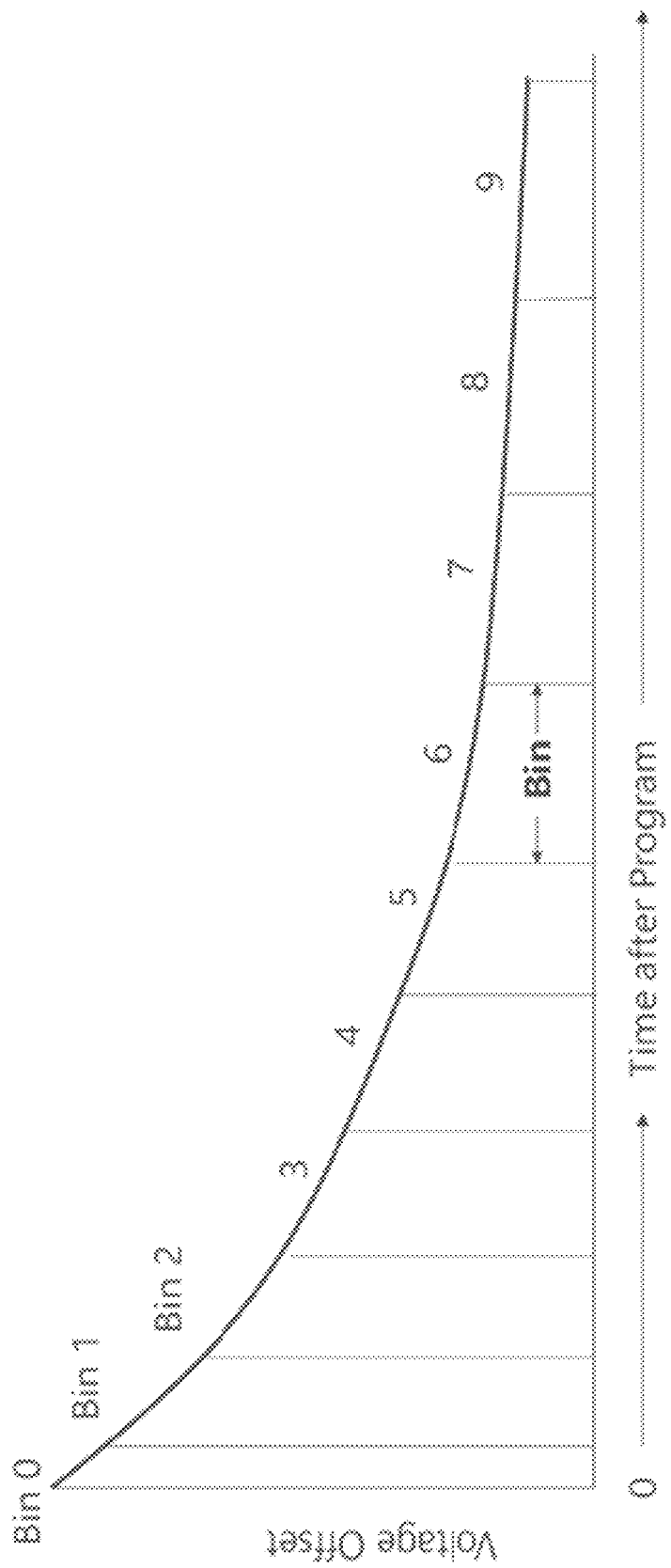
FIG. 3 schematically illustrates a set of predefined read voltage offset TAP bins, in accordance with embodiments of the present disclosure.

FIG. 3 schematically illustrates a set of predefined read voltage offset TAP bins (TAP bin 0 to TAP bin 9), in accordance with embodiments of the present disclosure. As schematically illustrated by FIG. 3, the read voltage offset graph may be subdivided into multiple read voltage offset TAP bins, such that each TAP bin corresponds to a predetermined range of read voltage offsets. While the illustrative example of FIG. 4 defines ten TAP bins, in other implementations, various other numbers of TAP bins may be employed (e.g., 64 TAP bins). Based on a periodically performed calibration process, the memory sub-system controller associates each die of every block family with a read voltage offset TAP bin, which defines a set of read voltage offsets to be applied to the base voltage read voltage level in order to perform read operations, as described in more detail herein below.

Figure 4:
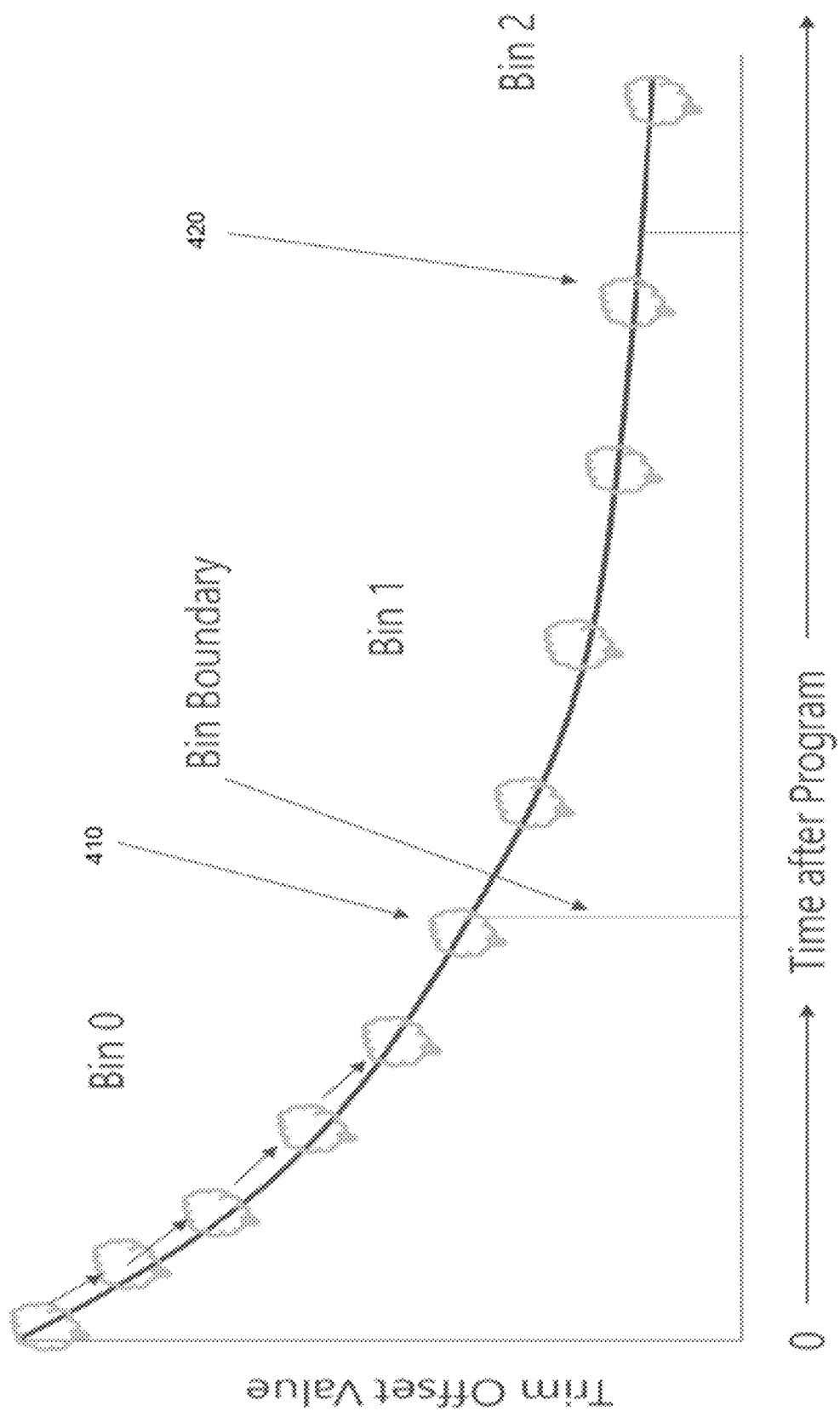
FIG. 4 schematically illustrates selecting block families for calibration, in accordance with embodiments of the present disclosure.

FIG. 4 schematically illustrates selecting block families for calibration, in accordance with embodiments of the present disclosure. As schematically illustrated by FIG. 4, the memory sub-system controller may limit the calibration operations to the oldest block family in each TAP bin (e.g., block family 410 in TAP bin 0 and block family 420 in TAP bin 1), since it is the oldest block family that will, due to the slow charge loss, migrate to the next TAP bin before any other block family of the current TAP bin.

Figure 5:
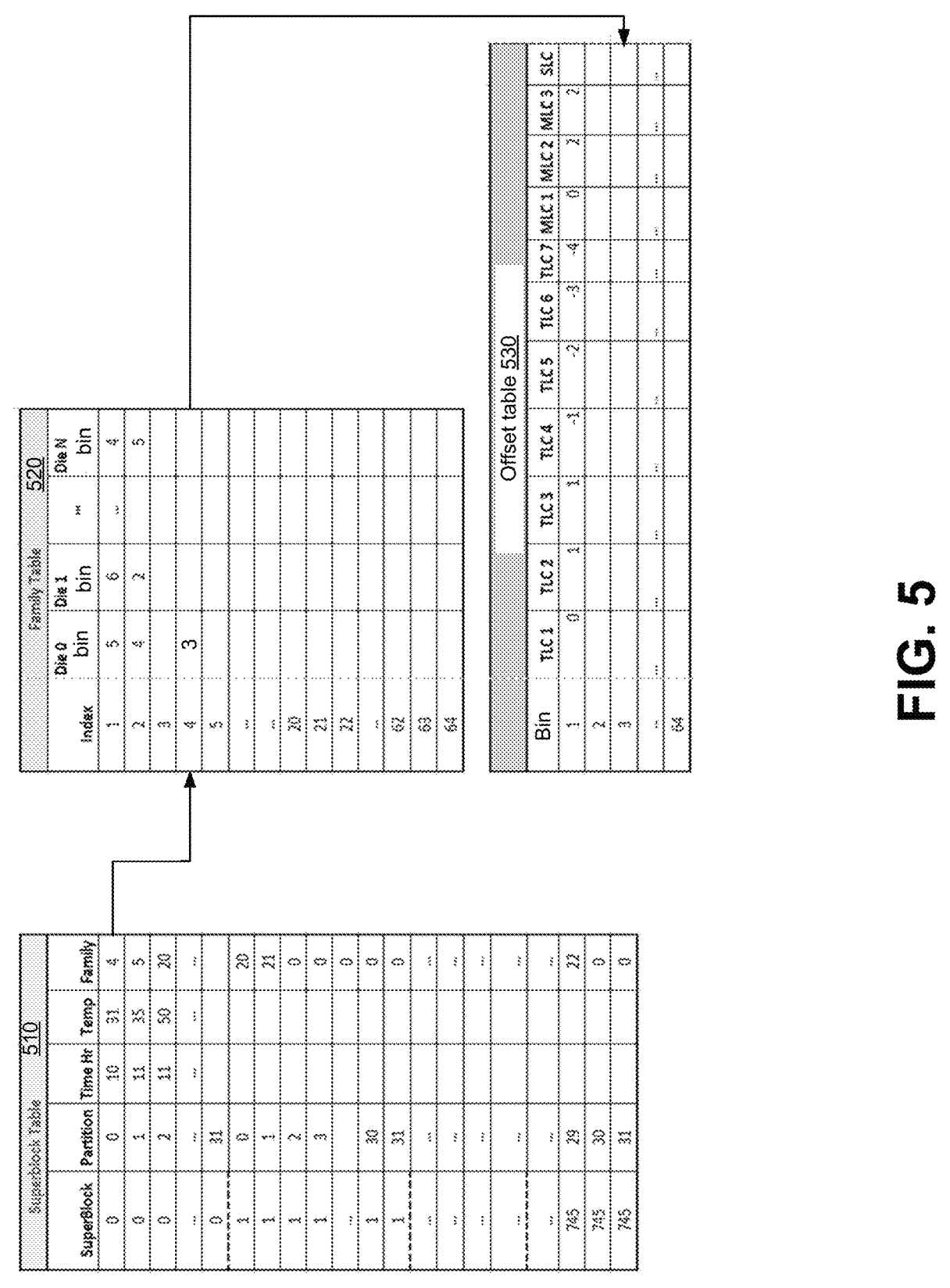

FIG. 5 schematically illustrates example metadata maintained by the memory sub-system controller for associating blocks and/or partitions with block families, in accordance with embodiments of the present disclosure. As schematically illustrated by FIG. 5, the memory sub-system controller may maintain the superblock table 510, the family table 520, and the read voltage offset table 530.

Each record of the superblock table 510 specifies the block family associated with combination of the specified management unit (e.g., block or superblock) and the partition of the management unit. In some implementations, the superblock table records may further include time and temperature values associated with the specified superblock and partition combination.

The family table 520 is indexed by the block family number, such that each record of the family table 520 specifies, for the block family referenced by the index of the record, a set of TAP bins associated with respective dies of the block family. In other words, each record of the family table 520 includes a vector, each element of which specifies the TAP bin associated with the die referenced by the index of the vector element. The TAP bins to be associated with the block family dies may be determined by the calibration process.

Finally, the offset table 530 is indexed by the bin number. Each record of the offset table 530 specifies a set of read voltage offsets (e.g., for TLC, MLC, and/or SLC) associated with TAP bin. The read voltage offsets may be additively applied to the corresponding base voltage levels in order to perform the requested read operation.

The metadata tables 510-530 may be stored on one or more memory devices 130 of FIG. 1. In some implementations, at least part of the metadata tables may be cached in the local memory 119 of the memory sub-system controller 115 of FIG. 1. In the illustrative example of FIG. 5, the superblock table 510 maps partition 0 of the superblock 0 to block family 4, which is utilized as the index to the family table 520 in order to determine that die 0 is mapped to bin 3. The latter value is used as the index to the offset table in order to determine the read voltage offset values for bin 3.

In operation, upon receiving a read command, the memory sub-system controller determines the physical address corresponding to the logical block address (LBA) specified by the read command. Components of the physical address, such as the physical block number and the die identifier, are utilized for performing the metadata table walk: first, the superblock table 510 is used to identify the block family identifier corresponding to the physical block number; then, the block family identifier is used as the index to the family table 520 in order to determine the TAP bin associated with the block family and the die; finally, the identified TAP bin is used as the index to the offset table 530 in order to determine the read voltage offset corresponding to the bin. The memory sub-system controller may then additively apply the identified read voltage offset to the base voltage read level in order to perform the requested read operation with request to the specified memory page.

Responsive to receiving an error in performing the read operation, the memory sub-system controller initiates an error correction flow, which may include one or more error correction operations. Each error correction operation may in turn include multiple read strobes with the varying read voltage level, such that each read strobe produces a codeword that is sensed from the memory device. The read strobes with the varying read voltage level are performed until the sensed codeword is successfully decoded or until an unrecoverable error state is not detected. The read voltage level that has produced the successfully decoded codeword is declared the last successful read voltage level for the memory page.

Upon identifying the last successful read voltage level, the memory sub-system controller stores a metadata record associating the block family that includes the block referenced by the read request with the last successful read voltage level, thus allowing the last successful read voltage level to be applied to subsequent read operations performed with respect to any memory pages of the same block family.

FIG. 6 schematically illustrates example metadata maintained by the memory sub-system controller for associating block families with respective last successful read levels, in accordance with embodiments of the present disclosure. As schematically illustrated by FIG. 6, the memory sub-system controller may maintain the last successful read voltage level table 610, which is indexed by the block family number. Each record of the last successful read voltage level table 610 specifies, for the block family referenced by the index of the record, a set of last successful read voltage levels corresponding to respective logical programming levels. In some implementations, the read voltage levels retrieved from the last successful read voltage level table 610 may be interpreted as offsets to be additively combined with the corresponding base voltage levels in order to perform the requested read operation. Alternatively, the read voltage levels retrieved from the last successful read voltage level table 610 may be directly applied in performing the requested read operation. The last successful read voltage level table 610 may be stored on one or more memory devices 130 of FIG. 1. In some implementations, at least part of the metadata tables may be cached in the local memory 119 of the memory sub-system controller 116 of FIG. 1.

In operation, upon receiving a read command, the memory sub-system controller determines the physical address corresponding to the logical block address (LBA) specified by the read command. Components of the physical address, such as the physical block number and the die identifier, are utilized for performing the metadata table walk: first, the superblock table 510 is used to identify the block family identifier corresponding to the physical block number; then, the block family identifier is used as the index to the last successful read voltage level table 610. Should a record corresponding to the block family associated with the block specified by the read request be found in the last successful read voltage level table 610, the memory sub-system controller retrieves, from the table 610, the last successful read voltage level and utilizes it for performing the requested read operation. Otherwise, should the last successful read voltage level table 610 contain no records associated with the block family associated with the block specified by the read request, the memory sub-system controller utilizes the block family identifier is used as the index to the family table 520 in order to determine the TAP bin associated with the block family and the die; finally, the identified TAP bin is used as the index to the offset table 530 in order to determine the read voltage offset corresponding to the bin. The memory sub-system controller then additively applies the identified read voltage offset to the base voltage read level in order to perform the requested read operation with request to the specified memory page.

Figure 7:
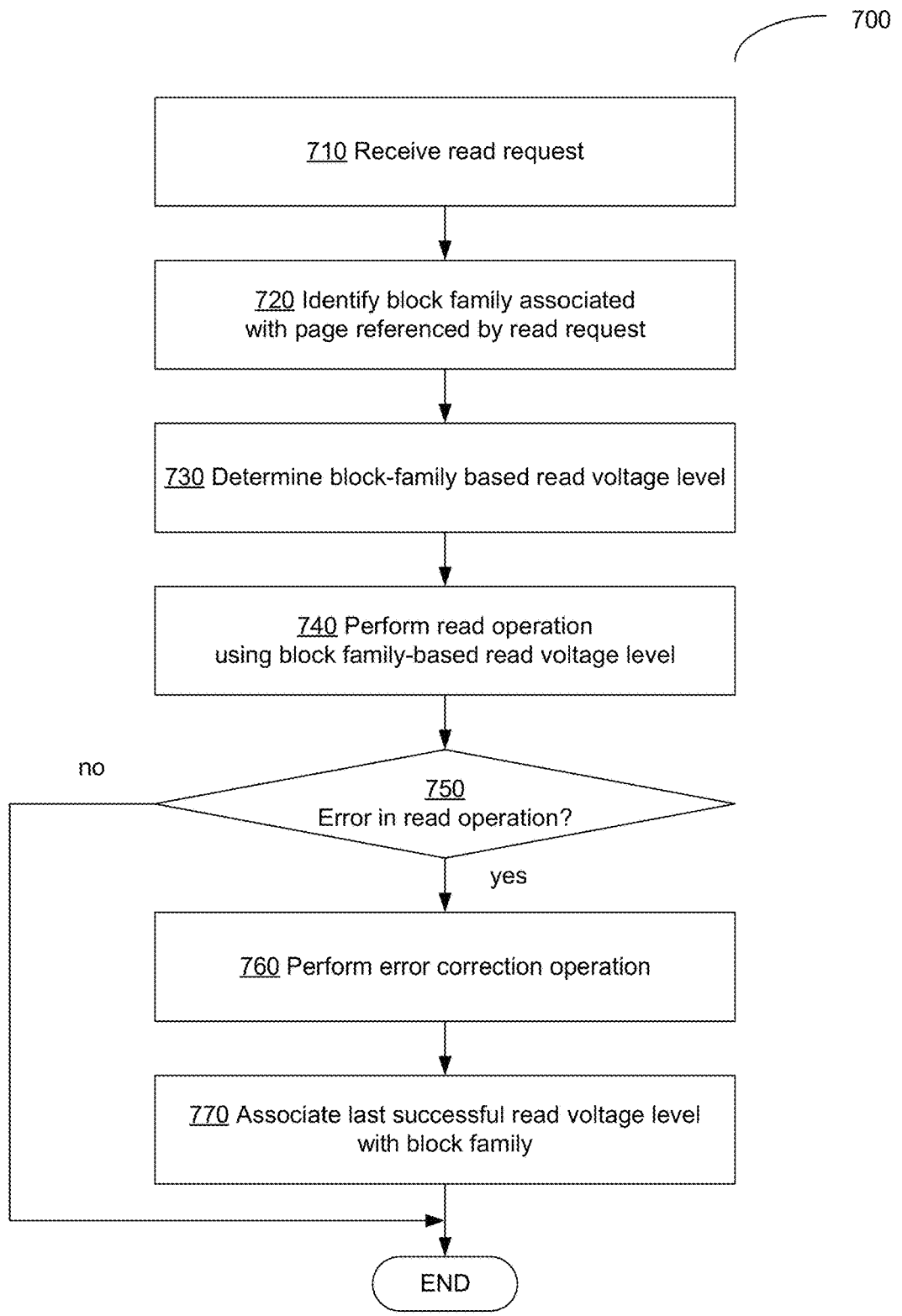
FIG. 7 a flow diagram of an example method of performing a memory access operation using the last successful read level, in accordance with some embodiments of the present disclosure.

FIG. 7 a flow diagram of an example method 700 of performing a memory access operation using the last successful read level, in accordance with some embodiments of the present disclosure. The method 700 may be performed by processing logic that may include hardware (e.g., processing device, circuitry, dedicated logic, programmable logic, microcode, hardware of a device, integrated circuit, etc.), software (e.g., instructions run or executed on a processing device), or a combination thereof. In some implementations, the method 700 is performed by memory access manager 113 of FIG. 1. Although shown in a particular sequence or order, unless otherwise specified, the order of the processes may be modified. Thus, the illustrated embodiments should be understood only as examples, and the illustrated processes may be performed in a different order, and some processes may be performed in parallel. Additionally, one or more processes may be omitted in various embodiments. Thus, not all processes are required in every embodiment.

At operation 710, the processing device implementing the method receives a request to perform a memory access operation (e.g., a read operation) with respect to a specified memory page, as described in more detail herein above.

At operation 720, the processing device identifies a block family associated with the page referenced by the read request. In an illustrative example, the processing device determines the physical address corresponding to the logical block address (LBA) specified by the read command. Components of the physical address, such as the physical block number and the die identifier, are utilized for performing the metadata table walk: in particular, the superblock table 510 of FIG. 5 is used to identify the block family identifier corresponding to the physical block number, as described in more detail herein above.

At operation 730, the processing device determines the block family-based read voltage level associated with the block family. In an illustrative example, the processing device utilizes the block family identifier as the index to the family table 520 of FIG. 5 in order to determine the TAP bin associated with the block family and the die; then, the identified TAP bin is used as the index to the offset table 530 of FIG. 5 in order to determine the read voltage level corresponding to the TAP bin.

At operation 740, the processing device performs, using the block family-based read voltage level determined by the operation 730, a read operation with respect to the memory page.

Responsive to determining, at operation 750, that the read operation 740 resulted in an error, the processing device, at operation 760, performs an error correction operation with respect to the memory page. The error correction operation may include multiple read strobes with the varying read voltage level, which may be performed until the sensed codeword is successfully decoded or until an unrecoverable error state is not detected. The new read voltage level that has produced the successfully decoded codeword is declared the last successful read voltage level for the memory page.

At operation 770, the processing device associates, by a last successful read voltage level memory data structure (e.g., data structure 610 of FIG. 6), the last the successful read voltage level with the block family. Upon performing the operation 770, the method terminates.

Figure 8:
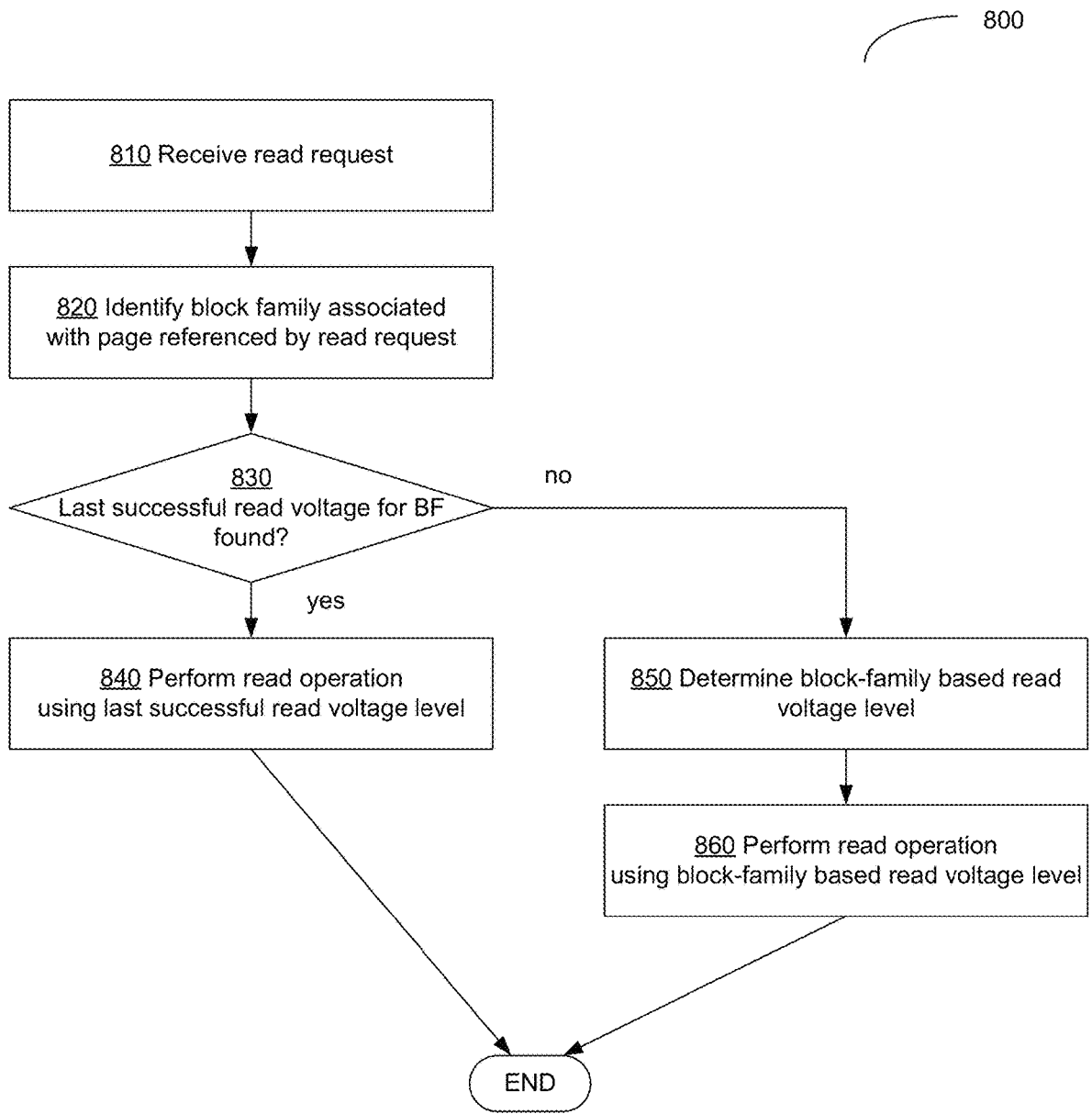
FIG. 8 a flow diagram of another example method of performing a memory access operation using the last successful read level, in accordance with some embodiments of the present disclosure.

FIG. 8 a flow diagram of an example method 800 of performing a memory access operation using the last successful read level, in accordance with some embodiments of the present disclosure. The method 800 may be performed by processing logic that may include hardware (e.g., processing device, circuitry, dedicated logic, programmable logic, microcode, hardware of a device, integrated circuit, etc.), software (e.g., instructions run or executed on a processing device), or a combination thereof. In some implementations, the method 800 is performed by memory access manager 113 of FIG. 1. Although shown in a particular sequence or order, unless otherwise specified, the order of the processes may be modified. Thus, the illustrated embodiments should be understood only as examples, and the illustrated processes may be performed in a different order, and some processes may be performed in parallel. Additionally, one or more processes may be omitted in various embodiments. Thus, not all processes are required in every embodiment.

At operation 810, the processing device implementing the method receives a request to perform a memory access operation (e.g., a read operation) with respect to a specified memory page, as described in more detail herein above.

At operation 820, the processing device identifies a block family associated with the page referenced by the read request. In an illustrative example, the processing device determines the physical address corresponding to the logical block address (LBA) specified by the read command. Components of the physical address, such as the physical block number and the die identifier, are utilized for performing the metadata table walk: in particular, the superblock table 510 of FIG. 5 is used to identify the block family identifier corresponding to the physical block number, as described in more detail herein above. In another illustrative example, the read request may be initiated internally by the memory sub-system (e.g., a media management operation, such as a media scan operation or a garbage collection operation).

At operation 830, the processing device determines the last successful read voltage level associated with the block family. In an illustrative example, the processing device utilizes the block family identifier as the index to the last successful read voltage level 610 of FIG. 6 in order to determine the read voltage level associated with the block family.

Responsive to successfully identifying, at operation 830, the last successful read voltage level associated with the block family, the processing device, at operation 840, performs, using the last successful read voltage level, a read operation with respect to the memory page, and the method terminates.

Responsive to failing to identify, at operation 830, the last successful read voltage level associated with the block family, the processing device, at operation 850, determines the block family-based read voltage level associated with the block family. In an illustrative example, the processing device utilizes the block family identifier as the index to the family table 520 of FIG. 5 in order to determine the TAP bin associated with the block family and the die; then, the identified TAP bin is used as the index to the offset table 530 of FIG. 5 in order to determine the read voltage level corresponding to the TAP bin.

At operation 860, the processing device performs, using the block family-based read voltage level determined by the operation 850, a read operation with respect to the memory page, and the method terminates.

Figure 9:
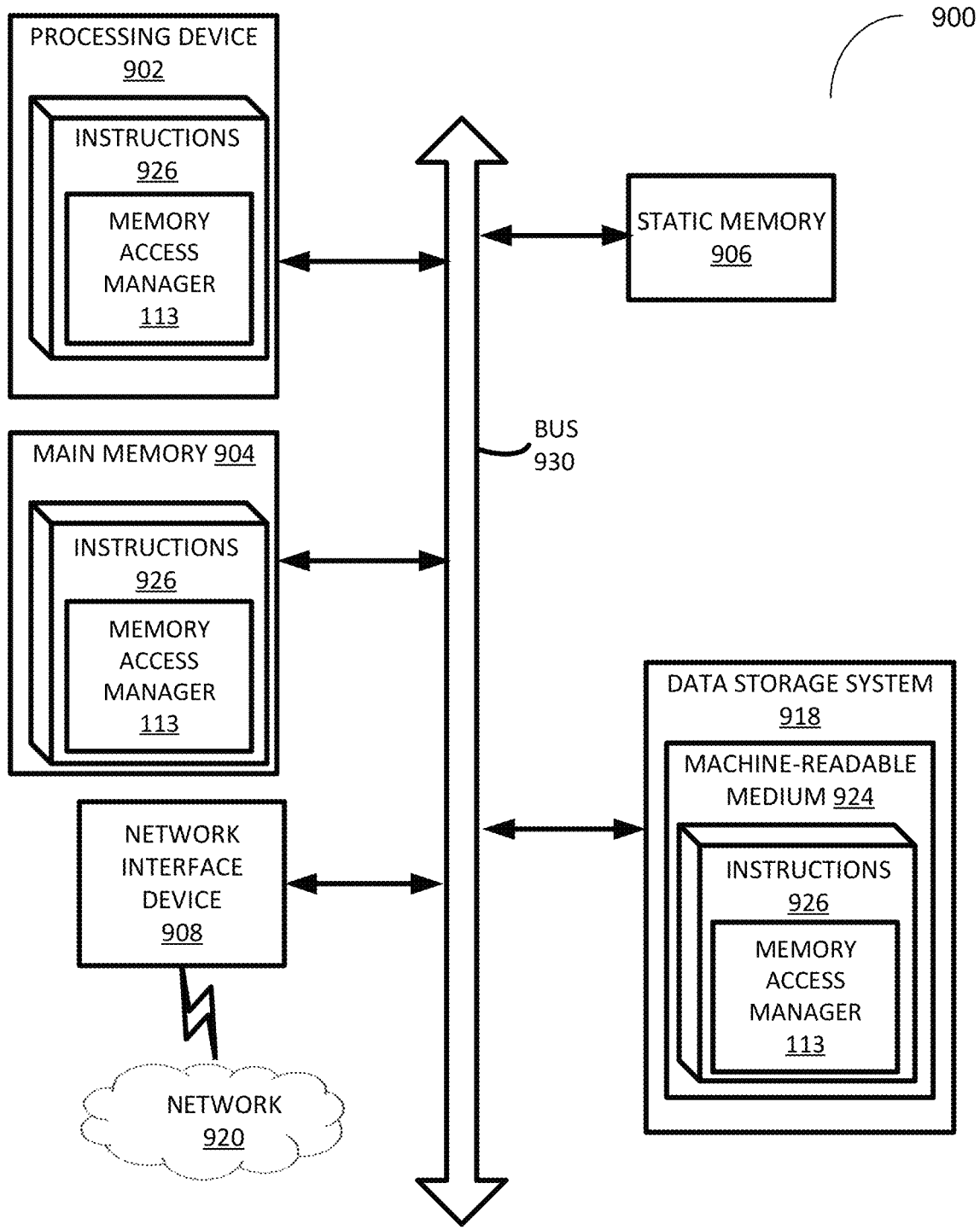
FIG. 9 is a block diagram of an example computer system in which embodiments of the present disclosure may operate.

FIG. 9 illustrates an example machine of a computer system 900 within which a set of instructions, for causing the machine to perform any one or more of the methodologies discussed herein, may be executed. In some embodiments, the computer system 900 may correspond to a host system (e.g., the host system 120 of FIG. 1) that includes, is coupled to, or utilizes a memory sub-system (e.g., the memory sub-system 110 of FIG. 1) or may be used to perform the operations of a controller (e.g., to execute an operating system to perform operations corresponding to the memory access manager 113 of FIG. 1). In alternative embodiments, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or RDRAM, etc.), a static memory 906 (e.g., flash memory, static random access memory (SRAM), etc.), and a data storage system 918, which communicate with each other via a bus 930.

Processing device 902 represents one or more general-purpose processing devices such as a microprocessor, a central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets, or processors implementing a comTAP bination of instruction sets. Processing device 902 may also be one or more special-purpose processing devices such as an application specific integrated circuit (ASIC), a field programmable gate array (FPGA), a digital signal processor (DSP), network processor, or the like. The processing device 902 is configured to execute instructions 926 for performing the operations and steps discussed herein. The computer system 900 may further include a network interface device 908 to communicate over the network 920.

The data storage system 918 may include a machine-readable storage medium 924 (also known as a computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media. The machine-readable storage medium 924, data storage system 918, and/or main memory 904 may correspond to the memory sub-system 110 of FIG. 1.

In one embodiment, the instructions 926 include instructions to implement functionality corresponding to a BFEA read voltage level management component (e.g., the memory access manager 113 of FIG. 1). While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, comTAPbined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure may refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus may be specially constructed for the intended purposes, or it may include a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct a more specialized apparatus to perform the method. The structure for a variety of these systems will appear as set forth in the description below. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications may be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
   responsive to receiving a read error associated with a read operation performed on a memory page of a memory device,
   determining, by performing an error correction operation, a new read voltage level associated with a block family of the memory page of the memory device;
   storing the new read voltage level as a last successful read voltage level in a record of a last successful read voltage level memory data structure associated with the block family;
   responsive to receiving a request to perform a subsequent read operation with respect to the memory page, retrieving the last successful read voltage level from the record of the last successful read voltage level memory data structure associated with the block family of the memory page; and
   performing, using the retrieved last successful read voltage level, the subsequent read operation with respect to the memory page.

2. The method of claim 1, further comprising:
   responsive to receiving a subsequent request to perform a subsequent read operation with respect to the memory page, retrieving the last successful read voltage level from the last successful read voltage level memory data structure; and
   performing, using the last successful read voltage level, a subsequent read operation with respect to the memory page.

3. The method of claim 1, wherein the read operation is performed using a block family-based read voltage level associated with a block family, wherein the block family is associated with a block comprising the memory page, and wherein the block family-based read voltage level is determined using a block family memory data structure comprising a plurality of records, each record mapping an identifier of a block family to a time-after-programming (TAP) bin.

4. The method of claim 3, wherein the TAP bin is associated with a plurality of voltage offsets, each voltage offset of the plurality of voltage offsets associated with a corresponding logical programming level of a plurality of logical programming levels.

5. The method of claim 1, wherein the successful read voltage level data structure comprises a plurality of records, wherein each record of the plurality of records associates a block family of a plurality of block families of the memory device with a plurality of voltage offsets, each voltage offset of the plurality of voltage offsets associated with a corresponding logical programming level of a plurality of logical programming levels.

6. The method of claim 1, wherein the block family comprises a plurality of blocks that have been programmed within a specified time window and a specified temperature window.

7. The method of claim 1, wherein identifying the block family associated with the block comprising the memory page is performed using a block family data structure comprising a plurality of records, each record mapping an identifier of a block family to a corresponding list of blocks comprised by the block family.

8. A system comprising:
   a memory device;
   a processing device, operatively coupled to the memory device, the processing device to perform operations comprising:
      responsive to receiving a read error associated with a read operation performed on respect to a memory page of the memory device,
      determining, by performing an error correction operation, a new read voltage level associated with a block family of the memory page of the memory device;
      storing the new read voltage level as a last successful read voltage level in a record of a last successful read voltage level memory data structure associated with the block family;
      responsive to receiving a request to perform a subsequent read operation with respect to the memory page, retrieving the last successful read voltage level from the record of the last successful read voltage level memory data structure associated with the block family of the memory page; and
      performing, using the retrieved last successful read voltage level, the subsequent read operation with respect to the memory page.

9. The system of claim 8, wherein the operations further comprise:
   responsive to receiving a subsequent request to perform a subsequent read operation with respect to the memory page, retrieving the last successful read voltage level from the last successful read voltage level memory data structure; and
   performing, using the last successful read voltage level, a subsequent read operation with respect to the memory page.

10. The system of claim 8, wherein the read operation is performed using a block family-based read voltage level associated with a block family, wherein the block family is associated with a block comprising the memory page, and wherein the block family-based read voltage level is determined using a block family memory data structure comprising a plurality of records, each record mapping an identifier of a block family to a time-after-programming (TAP) bin.

11. The system of claim 10, wherein the TAP bin is associated with a plurality of voltage offsets, each voltage offset of the plurality of voltage offsets associated with a corresponding logical programming level of a plurality of logical programming levels.

12. The system of claim 8, wherein the successful read voltage level data structure comprises a plurality of records, wherein each record of the plurality of records associates a block family of a plurality of block families of the memory device with a plurality of voltage offsets, each voltage offset of the plurality of voltage offsets associated with a corresponding logical programming level of a plurality of logical programming levels.

13. The system of claim 8, wherein the block family comprises a plurality of blocks that have been programmed within a specified time window and a specified temperature window.

14. The system of claim 8, wherein identifying the block family associated with the block comprising the memory page is performed using a block family data structure comprising a plurality of records, each record mapping an identifier of a block family to a corresponding list of blocks comprised by the block family.

15. A non-transitory computer-readable storage medium comprising instructions that, when executed by a processing device, cause the processing device to perform operations comprising:
 responsive to receiving a read error associated with a read operation performed on a memory page of a memory device,
 determining, by performing an error correction operation, a new read voltage level associated with a block family of the memory page;
 storing the new read voltage level as a last successful read voltage level in a record of a last successful read voltage level memory data structure associated with the block family;
 responsive to receiving a request to perform a subsequent read operation with respect to the memory page, retrieving the last successful read voltage level from the record of the last successful read voltage level memory data structure associated with the block family of the memory page; and
 performing, using the retrieved last successful read voltage level, the subsequent read operation with respect to the memory page.

16. The non-transitory computer-readable storage medium of claim 15, further comprising:
 responsive to receiving a subsequent request to perform a subsequent read operation with respect to the memory page, retrieving the last successful read voltage level from the last successful read voltage level memory data structure; and
 performing, using the last successful read voltage level, a subsequent read operation with respect to the memory page.

17. The non-transitory computer-readable storage medium of claim 15, wherein the read operation is performed using a block family-based read voltage level associated with a block family, wherein the block family is associated with a block comprising the memory page, and wherein the block family-based read voltage level is determined using a block family memory data structure comprising a plurality of records, each record mapping an identifier of a block family to a time-after-programming (TAP) bin.

18. The non-transitory computer-readable storage medium of claim 15, wherein the successful read voltage level data structure comprises a plurality of records, wherein each record of the plurality of records associates a block family of a plurality of block families of the memory device with a plurality of voltage offsets, each voltage offset of the plurality of voltage offsets associated with a corresponding logical programming level of a plurality of logical programming levels.

19. The non-transitory computer-readable storage medium of claim 15, wherein the block family comprises a plurality of blocks that have been programmed within a specified time window and a specified temperature window.

20. The non-transitory computer-readable storage medium of claim 15, wherein identifying the block family associated with the block comprising the memory page is performed using a block family data structure comprising a plurality of records, each record mapping an identifier of a block family to a corresponding list of blocks comprised by the block family.

* * * * *